United States Patent [19]
Khlat

[11] Patent Number: 6,069,535
[45] Date of Patent: May 30, 2000

[54] SEQUENCE GENERATOR FOR FRACTIONAL FREQUENCY DIVIDER IN PLL FREQUENCY SYNTHESIZER

[75] Inventor: Nadim Khlat, Cugneaux, France

[73] Assignee: Motorola, Inc., Schaumburg, Ill.

[21] Appl. No.: 09/260,351

[22] Filed: Mar. 2, 1999

[51] Int. Cl.[7] .............................. H03C 3/09; H03L 7/197
[52] U.S. Cl. .............................. 331/1 A; 331/16; 331/25; 332/127; 377/48
[58] Field of Search ................. 331/1 A, 16, 25; 332/127, 128; 377/48

[56] References Cited

U.S. PATENT DOCUMENTS

| 5,166,642 | 11/1992 | Hietala | 331/1 A |
| 5,495,206 | 2/1996 | Hietala | 331/1 A |

FOREIGN PATENT DOCUMENTS

| 0429217 | 5/1991 | European Pat. Off. | H03L 7/197 |
| 9107824 | 5/1991 | WIPO | H03L 7/197 |

OTHER PUBLICATIONS

"A Multiple Modulator Fractional Divider", Miller, IEEE Transactions on Instrumentation and Measurement, vol. 40, No. 3, Jun. 1991, New York, US, pp. 578–583.

"Delta–Sigma Modulation in Fractional–N Frequency Synthesis", Riley et al., IEEE Journal of Solid–State Circuits, vol. 28, No. 5, May 1993, New York, pp. 553–559.

*Primary Examiner*—Siegfried H. Grimm
*Attorney, Agent, or Firm*—Anthony M. Martinez

[57] ABSTRACT

A sequence generator 10 for a frequency synthesiser 1,2,3,4,5,10 forming part of a direct modulator comprises an input 10a for receiving an input multibit signal X(z), an output 10c for outputting an output digital signal Y(z) and sequence generation means 10b. The sequence generation means is adapted to produce a noise transfer function which has a minimum value both at the frequency corresponding to the dc component of the input signal and at one or more frequencies away from the frequency corresponding to the dc component of the input signal.

12 Claims, 4 Drawing Sheets

SEQUENCE GENERATOR FOR FRACTIONAL FREQUENCY DIVIDER IN PLL FREQUENCY SYNTHESIZER

FIELD OF THE INVENTION

The present invention relates to a frequency synthesiser and in particular to a fractional-N frequency synthesiser for providing direct modulation of a carrier signal for radio transmission. Such synthesisers find application in radiotelephone communications equipment.

BACKGROUND OF THE INVENTION

Phase locked loop frequency synthesis is a well known technique for generating one of many related signals from a variable-frequency voltage-controlled-oscillator (VCO). In a single loop PLL, an output signal from the VCO is coupled to a programmable frequency divider. The programmable frequency divider divides by a selected integer number, providing a frequency divided signal to a phase detector. The phase detector compares the frequency divided signal to a reference signal from another fixed frequency oscillator (typically a relatively stable crystal oscillator). Any difference in phase between the frequency divided signal and the reference signal is output from the phase detector, via a low-pass filter, and applied to the VCO. The phase difference signal causes the output signal from the VCO to change in frequency so as to minimise the phase difference between the frequency divided signal and the reference signal. Clearly, by varying the integer by which the signal from the VCO is divided, the signal from the VCO will change correspondingly.

Since the frequency divider can only divide by integers, the earliest frequency synthesisers of this nature were only used to generate step-wise variations in the output frequency (e.g. to generate separate channel frequencies to be further modulated by a conventional mixer to generate the ultimately desired modulated rf signals). In this case an increase in the dividing integer of 1 would correspond to an increase in the output signal from the VCO of one channel spacing, the channel spacing being equal therefore to the frequency of the reference signal from the fixed frequency oscillator.

Fractional-N synthesisers have since been developed which effectively divide the output signal from the VCO by a non-integer. This is done using a similar principle to that involved in Sigma-Delta Digital-to-Analogue conversion. By rapidly varying the integer used for dividing the output signal from the VCO and then low pass filtering the phase difference signal to generate an average phase difference signal, the VCO can be made to generate a signal corresponding to a non-integer multiple of the fixed frequency reference signal.

This process can then be carried a step further to produce direct modulation of the rf carrier signal by varying the non-integer multiple of the fixed frequency reference signal to produce frequency or phase modulation, provided the rate of changing the instantaneous integer dividing value (or the sampling frequency) is higher than the highest important frequency of the modulating signal. This is easily achievable with modern systems. Such a direct modulation system is generally well known in the art and is for example described in U.S. Pat. No. 5,166,642.

The principal problem with such systems is that a large amount of noise is generated (this noise may be thought of as quantisation noise). The noise has a substantially flat frequency spectrum, on either side of the central frequency of the channel up to ±(sampling frequency)/2. The PLL arrangement as a whole acts as a band pass filter which reduces the effect of noise whose frequency is beyond the corner frequencies of the PLL arrangement. The frequency response of the PLL arrangement is not ideal but is nonetheless of a reasonably high order. Thus arrangements have been devised which shape the noise signal in terms of its frequency spectrum to shift the majority of the noise to frequencies beyond the corner frequencies of the PLL arrangement. The above mentioned U.S. Pat. No. 5,166,642 is an example of such an arrangement using a multiple accumulator approach to provide a suitable noise transfer function.

Such arrangements have significantly reduced the amount of noise generated by fractional-N synthesisers. However, with increasing signal-to-noise ratio requirements in modem telephonic environments, there remains a need to further reduce the noise generated by fractional-N synthesisers.

Also, two key parameters are to be considered in Direct Modulation, the peak phase error and the rms phase error of the phase modulation. For a given modulation bandwidth, the peak phase error is mainly influenced by the PLL frequency response and bandwidth which introduce a distortion on the modulation signal. To reduce this peak error, there is a need to increase the PLL bandwidth versus the modulation bandwidth, however, for higher PLL bandwidth and a given noise density, the overall noise is increased which then increases the rms phase error. Thus there is a tradeoff between PLL bandwidth and rms phase error. It would be desirable to reduce the overall rms phase error for a higher PLL bandwidth.

SUMMARY OF THE INVENTION

According to a first aspect of the present invention, there is provided a sequence generator for a frequency synthesiser, the generator comprising an input for receiving an input signal, an output for outputting an output signal and sequence generation means for generating the output signal which is equal to the input signal plus a noise signal modulated by a noise transfer function which has a minimum value both at the frequency corresponding to the dc component of the input signal and at one or more frequencies away from the frequency corresponding to the dc component of the input signal.

The term minimum value is here used in the mathematical sense of a trough in the curve of modulation against frequency; typically the modulation will be zero at the minimum value.

According to a second aspect of the present invention, there is provided a method of generating a sequence for a frequency synthesiser forming part of a direct modulator, the method comprising the step of generating an output signal which is equal to an input signal plus a noise signal modulated by a noise transfer function, wherein the noise transfer function has a minimum value both at the frequency corresponding to the dc component of the input signal and at one or more frequencies away from the frequency corresponding to the dc component of the input signal.

$$He(z) = (1 - z^{-1})^n \cdot \frac{(1 - a \cdot z^{-1} + z^{-2})}{\left(1 - \frac{a}{2} \cdot z^{-1}\right)}$$

Preferably the noise transfer function is given by where n is an integer greater than or equal to 1 and a is a coefficient not equal to 2.

BRIEF DESCRIPTION OF THE FIGURES

In order that the present invention may be better understood, an embodiment thereof will now be described by way of example only and with reference to the accompanying drawings in which.

DETAILED DESCRIPTION OF THE INVENTION

The present invention provides a method and apparatus for producing a noise transfer function having at least one minimum located away from the central channel frequency. Preferred embodiments of how this may be achieved are described below.

Figure 1:
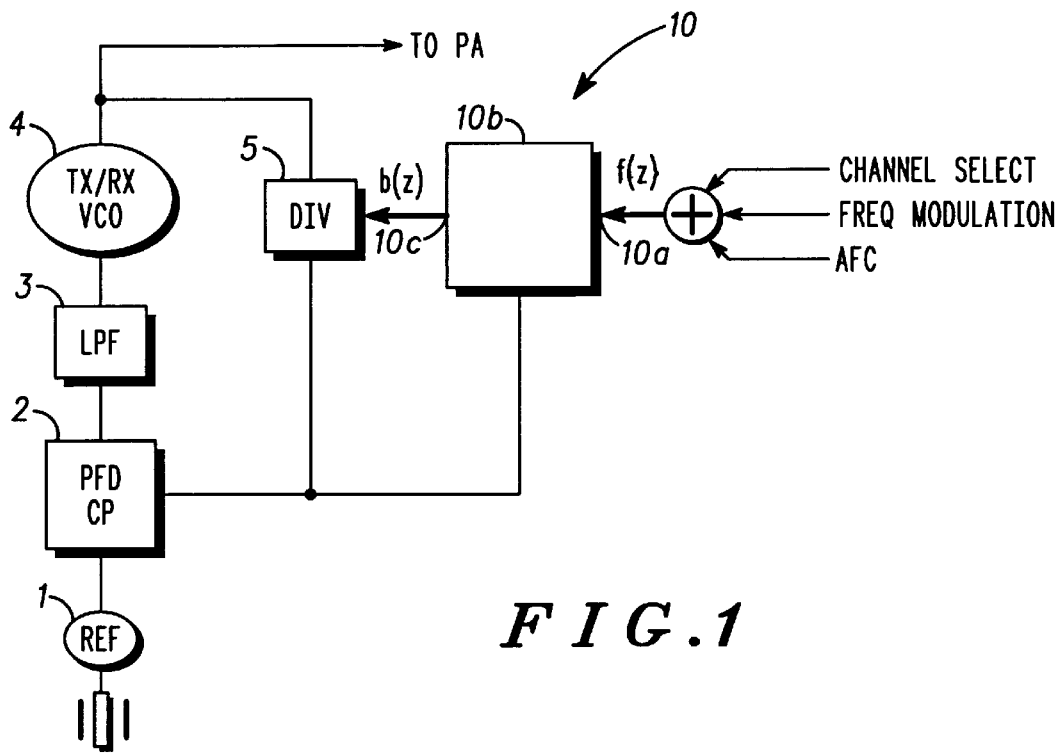
FIG. 1 is a block diagram of a direct modulation, fractional-N synthesiser arrangement.

The fractional-N synthesiser arrangement of FIG. 1 comprises a reference oscillator 1, a PLL arrangement 2,3,4,5 and a sequence generator 10 having an input 10a, an output 10c and sequence generation means 10b. The reference oscillator (e.g. a crystal oscillator) 1 produces a substantially constant frequency reference signal having a frequency of the order of a few MHz.

The reference signal is applied to the PLL arrangement. The PLL arrangement comprises a phase detector 2, a low-pass filter 3, a relatively high frequency variable voltage-controlled-oscillator (VCO) 4 and a frequency divider 5. The signal generated by the VCO 4 is outputted to the frequency divider 5 which produces a divided down signal whose frequency is approximately equal to the reference signal. The divided down signal and the reference signal are then both inputted to the phase detector 2 which compares these signals and produces a phase difference signal dependent on the phase difference between the divided down and reference signals.

The phase difference signal is passed through low-pass filter 3 and then on to VCO 4 where the low-pass filtered phase difference signal acts on VCO 4, in essence, to alter the frequency of the signal generated by VCO 4 so as to minimise the phase difference between the divided down and reference signals. However, because the amount (i.e. the divisor N) by which the signal output from VCO 4 is being divided down is constantly changing very rapidly (as is explained below), the instantaneous value of the divided down signal and, therefore, the phase difference signal also change rapidly. By appropriate selection of the characteristics of the low-pass filter 3, one can arrange for the low-pass filtered phase-difference signal to represent a time-averaged value of the instantaneous values of the phase-difference signal, over a desired timescale. The time-averaged phase difference signal then acts on VCO 4 such that the time-averaged signal is substantially equal to the reference frequency. In this way it is possible for the signal output from VCO 4 to have a frequency which is a non-integer multiple of the reference frequency.

In order to produce a frequency-modulated signal from the VCO, it is necessary that the low-pass filter 3 only filters out signals whose frequency is higher than the highest frequency component of the modulating signal used for frequency modulating the signal from the VCO. Thus the rate of changing the value of the divisor N must be significantly greater than the highest frequency component of the modulating signal.

In the arrangement of FIG. 1, the divisor N may, instantaneously, take any one of a number of different integer values (e.g. between 0 and 15). In such an arrangement, a number of different sequences can be used to generate the same time-averaged value. For example, the time-averaged value 7.5 could be generated by the sequence 7,8,7,8,7,8 or by the sequence 5,6,7,8,9,10 or by the sequence 0,15,0,15,0,15. A suitable sequence of instantaneous values of the divisor N is generated by sequence generator 10. Sequence generator 10 receives at its input 10a a large digital input signal (e.g. 32 bits) f(z) and generates, by means of sequence generation means 10b, at its output 10c a rapid sequence of much smaller digital signals (e.g. 4 bits) b(z) whose time averaged value corresponds to the original input signal f(z). In a further embodiment, sequence generator 10 additionally performs a digital integration of the input signal such that the output signal corresponds to the input signal after integration. This is useful for performing phase as opposed to frequency modulation.

Figure 2:
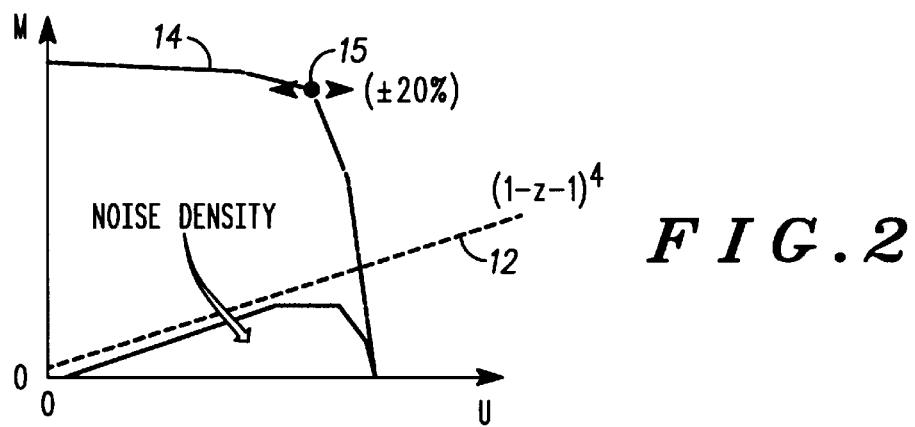
FIG. 2 is a diagramatic graph of Modulation M vs. Frequency U for the case of a conventional noise transfer function.
Figure 3:
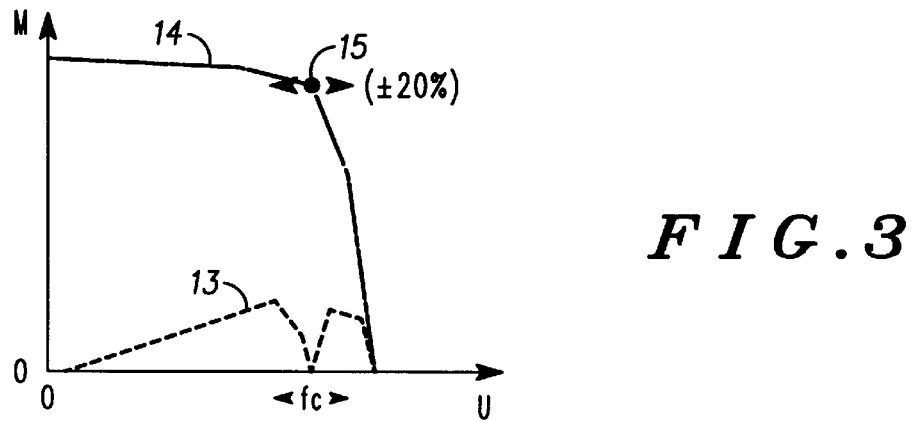
FIG. 3 is a diagramatic graph similar to FIG. 2 for the case of a noise transfer function produced according to the present invention.

The process performed by the sequence generator inevitably produces noise. A very basic sequence generator comprising just a single accumulator produces substantially white noise. A more complicated multi-accumulator sequence generator produces noise which has been modulated by a noise transfer function such as that shown by dotted line 12 in FIG. 2. The sequence generator in accordance with the present invention generates noise which has been modulated by a noise transfer function such as that shown by dotted line 13 in FIG. 3. It can be seen from FIG. 3 that, unlike the case in FIG. 2, an additional minimum has been inserted into the noise transfer function a frequency fc away from the channel central frequency. Dotted line 14 in FIGS. 2 and 3 shows the effect of the PLL bandwith as a general modulating function which modulates both the modulating signal(i.e. the voice or data signal which is to modulate the carrier signal or central channel frequency signal) and the noise. It can be seen that the PLL acts as a low-pass filter having a comer frequency 15 where the modulating function starts to fall from a high value (which effectively allows both the modulating signal and noise to pass unhindered) rapidly towards zero (where both the modulating signal and noise are effectively blocked by the PLL). Generally the VCO 4 will not be perfectly linear across its entire operative frequency range and as a result the PLL bandwidth will vary across the operative frequency range of the VCO 4, possibly by as much as 20% in a typical GSM system (as shown schematically in FIGS. 2 and 3 in terms of the posible movement of the comer frequency 15).

Figure 4:
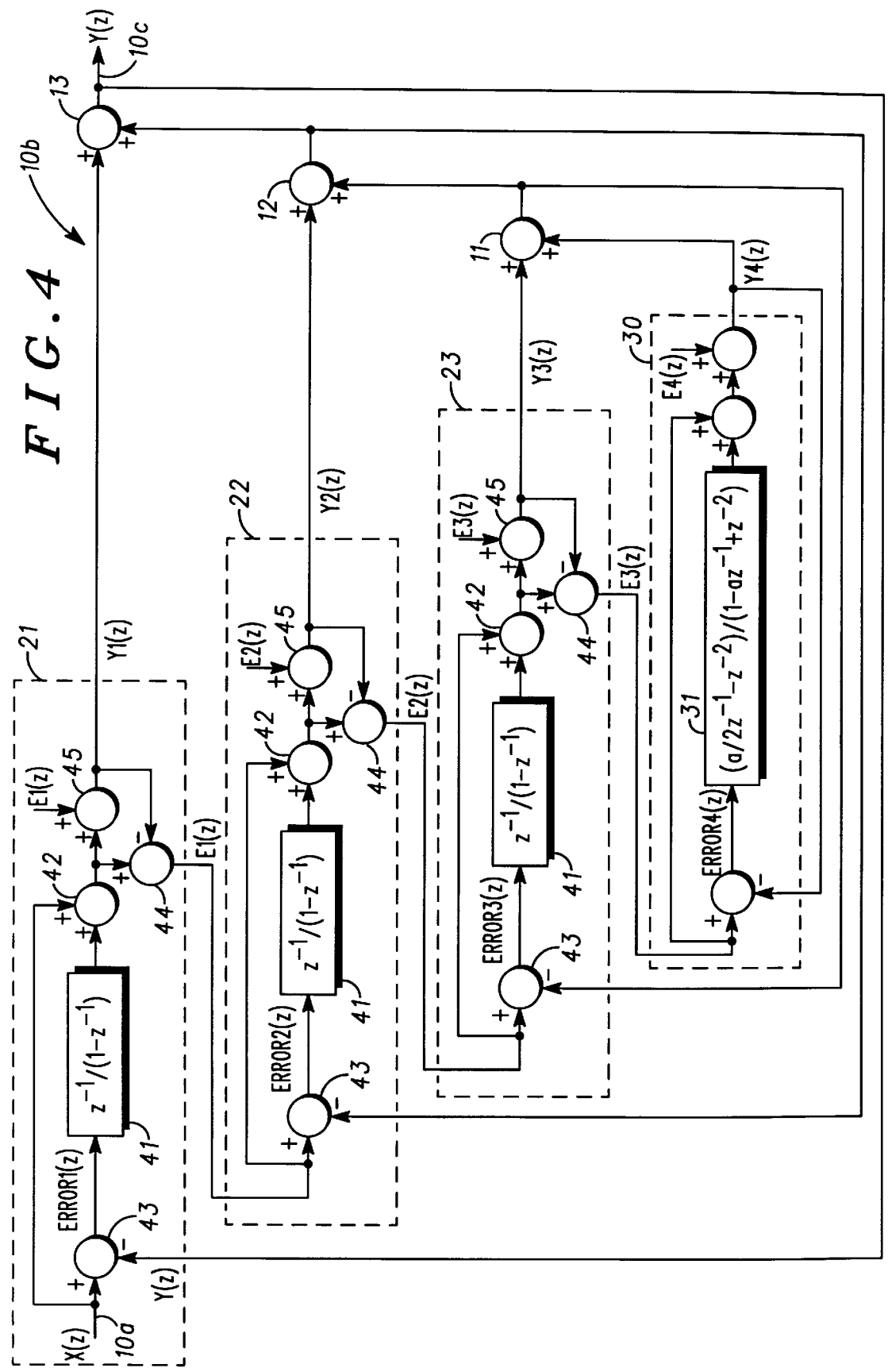
FIG. 4 is a diagramatic z-model of an arrangement according to the present invention for generating a desired noise transfer function similar to that illustrated in FIG. 3.

Referring now to FIG. 4, there is shown a z-model of a sequence generator 10 having an input 10a, an output 10c and sequence generation means 10b which generates noise which has been modulated by a noise transfer function such as that shown by dotted line 13 in FIG. 3. In essence sequence generation means 10b comprises 3 accumulator blocks 21,22,23 and a multiplier block 30. Each accumulator block contains a z-transform transfer function sub-block 41 which is simply the z-model of an accumulator, one adder 42, two subtractors 43,44 and an adder/comparator 45. The adder/comparator 45 is the z-model of a comparator and is represented as an adder which adds the input signal to a random noise signal, the random noise signal being the difference between the output generated by a comparator and the signal input to it. The multiplier block 30 is similar to the accumulator blocks except that a more complicated multiplier sub-block 31 replaces the simple z-transform transfer function sub-block 41 and one of the subtractors is omitted since the noise signal generated by the comparator in this block does not need to be fed into any further blocks. Additionally, the z-model of the sequence generator includes three further adders 11,12,13 for successively adding the outputs of the various blocks together.

A straightforward mathematical analysis of the z-model of FIG. 4 gives rise to the following expression of the output signal Y(z) in terms of the input signal X(z) and the noise signal E4(z) generated by the comparator of the multiplier block 30

$$Y(z) = X(z) + (1 - z^{-1})^3 \cdot \frac{(1 - a \cdot z^{-1} + z^{-2})}{\left(1 - \frac{a}{2} \cdot z^{-1}\right)} \cdot E4(z)$$

Thus it can be seen that the output signal, Y(z), is equal to the input signal, X(z), plus a flat noise signal, E4(z), which has been modulated by a noise transfer function, He(z), where:

$$He(z) = (1 - z^{-1})^3 \cdot \frac{(1 - a \cdot z^{-1} + z^{-2})}{\left(1 - \frac{a}{2} \cdot z^{-1}\right)}$$

This noise transfer function, He(z), will be recognised by persons skilled in the art as the noise transfer function of a three accumulator sequence generator multiplied by the non-standard term:

$$\frac{(1 - a \cdot z^{-1} + z^{-2})}{\left(1 - \frac{a}{2} \cdot z^{-1}\right)}$$

If a is chosen such that:

$$a = 2\cos\left(2\pi \cdot \frac{f_c}{f_{ref}}\right) = e^{i2\pi f_c/f_{ref}} + e^{-i2\pi f_c/f_{ref}}$$

(where $f_{ref}$ is the sampling frequency or clocking frequency of the sequence generator) then the effect of the non-standard term is easily shown to be to introduce a further zero into the noise transfer function at $\pm f_c$ of the channel central frequency, as desired by the present invention, given that z is given by:

$$z = e^{i \cdot 2\pi \frac{f}{f_{ref}}}$$

By setting $f_c$ to be approximately equal to the corner frequency of the PLL arrangement, it is possible to greatly increase the signal to noise ratio of the final signal for a given PLL frequency response and bandwidth.

Figure 5:
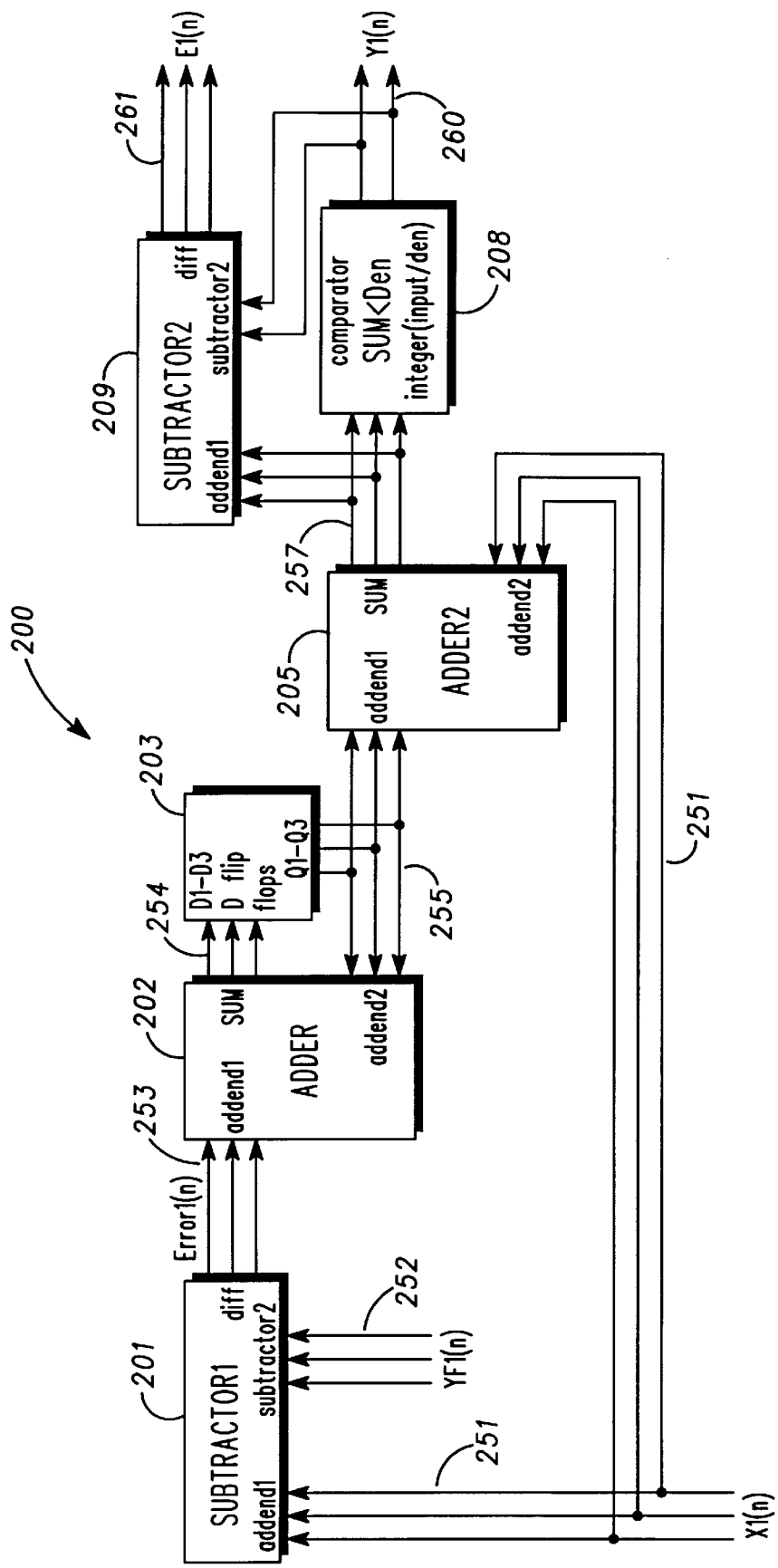
FIG. 5 is a block diagram of an accumulator block suitable for use in the present invention.

FIG. 5 is an example of an accumulator digital subcircuit 200 which could be used to form one of the accumulator sub-blocks whose z-models 21,22,23 are shown in FIG. 4. Accumulator digital subcircuit 200 comprises a first subtractor 201 which subtracts a second input signal 252 from a first input signal 251 to form a difference signal 253. Difference signal 253 is input to an accumulator 202,203 which comprises an accumulator adder 202 whose output 254 is fed to digital delay unit 203 (which simply comprises a plurality of D flip-flops, one for each bit of the signal to be delayed). The output of the delay unit 203 forms the accumulator output signal 255 which is fed back into adder 202 where it is added to difference signal 253 to form the new output of adder 202. The output 254 of accumulator adder 202 will form the output signal 255 of the accumulator after a delay of one clock period.

The accumulator output signal 255 is fed to an adder 205 to which is also input the first input signal 251 to form a sum signal 257. The sum signal 257 output from adder 205 is fed to a comparator 208 where sum signal 257 is compared with a denominator number stored in the comparator 208. The comparator essentially performs the function of dividing sum signal 257 by the denominator and outputting the integer result of the division (i.e. ignoring or initially subtracting any fractional part of the result). The output of the comparator 208 forms the principal output signal 260 of the accumulator digital subcircuit 200. However, a secondary output signal 261 is formed from a second subtractor 209. Second subtractor 209 receives as inputs sum signal 257 and principal output signal 260 which is subtracted from sum signal 257 to form secondary output signal 261. The secondary output signal 261, as can more easily be seen with reference to FIG. 4, is the noise signal generated by the comparator, the noise signal being the difference between the input and output of the comparator 208.

The secondary output signal 261 is fed into a further accumulator sub-block 22,23 or into the multiplier sub-block 30. The principal output signal 260 is added to the principal output signals of the other sub-blocks 21,22,23,30 to form the overall output Y of the sequence generator 10.

Figure 6:
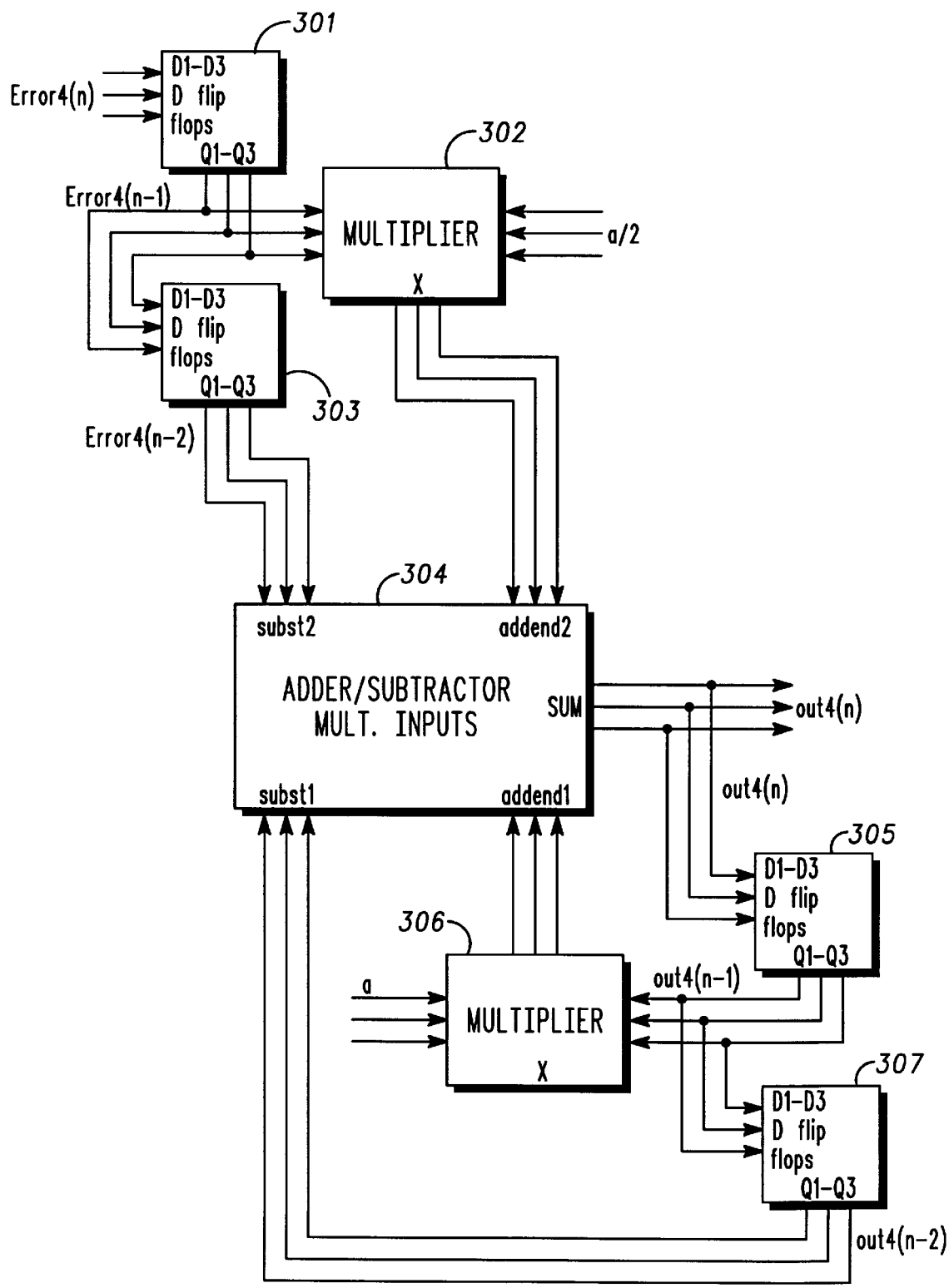
FIG. 6 is a block diagram of a multiplier block suitable for use in the present invention.

FIG. 6 is an example of a multiplier subcircuit 300 which could be used instead of the accumulator 202,203 in accumulator sub-block 200 to form a multiplier sub-block 30 whose z-model is shown in FIG. 4. Note that the multiplier sub-block 30 is the most deeply embedded sub-block and therefore the second subtractor 209 of the basic sub-block structure can be omitted since the error signal E4(z) generated by the comparator associated with the multiplier sub-block 30 does not need to be fed to any further sub-blocks.

The multiplier sub-circuit 300 comprises first, second, third and fourth delay units 301, 303, 305, 307, first and second multipliers 302, 306, each of which has first and second inputs and an output, and a multiple input adder/subtractor unit 304 which has first and second adding inputs, first and second subtracting inputs and an output. The input to the first delay unit 301 forms the input to the multiplier sub-circuit 300. The output of the first delay unit 301 is connected both to the first input of the first multiplier 302 and to the second delay unit 303. The output of first multiplier 302 is connected to the first adding input of the adder/subtractor unit 304. The output of the second delay unit 303 is connected to the first subtracting input of the adder/subtractor unit 304. The output of the adder/subtractor unit 304 forms the output of the multiplier sub-circuit 300. Additionally, the output of the adder/subtractor unit 304 is connected to the third delay unit 305. The output of third delay unit 305 is connected to the first input of the second multiplier 306 and to the fourth delay unit 307. The output of the second multiplier 306 is connected to the second adding input of the adder/subtractor unit 304. The output of the fourth delay unit 307 is connected to the second subtracting input of the adder/subtractor unit 304.

By applying the number a/2 to the second input of the first multiplier 302 and the number a to the second input of the second multiplier 306 (where a is given by the above quoted expression in terms of $f_c$), and bearing in mind that delaying a signal by one clockpulse is equivalent in the z-domain to multiplying the signal by $z^{-1}$, it is straightforward to analyse FIG. 6 and confirm that, in the z-domain, the output of the multiplier sub-circuit 300 is given by:

$$Out(z) = In(z)\left(\frac{a}{2}z^{-1} - z^{-2}\right) + Out(z)(a \cdot z^{-1} - z^{-2}) \Rightarrow$$

$$\frac{Out(z)}{In(z)} = \frac{\frac{a}{2}z^{-1} - z^{-2}}{1 - a \cdot z^{-1} + z^{-2}}$$

as required.

It is now possible to see how a sequence generator could be designed whose z-model is given by FIG. 4 using the sub-circuits of FIGS. 5 and 6. Accumulator sub-blocks 21,22,23 can be formed by first, second and third accumulator sub-circuits 200, while the multiplier sub-block 30 could be formed by replacing the accumulator 202,203 of a basic accumulator sub-circuit with the multiplier sub-circuit 300 of FIG. 6. The secondary output signal of the first, second and third sub-circuits should be connected to the first input of the second and third accumulator subcircuits and the multiplier sub-block 30 respectively. The principal outputs of the third accumulator sub-circuit 23 and the multiplier sub-block 30 should be connected to a first adder 11; the output of the first adder 11 should be connected to second adder 12 together with the principal output of the second accumulator subcircuit 22; and the output of the second adder 12 should be connected to third adder 13 together with the principal output of the first accumulator sub-circuit 21. The principal output of the multiplier sub-block 30 (which does not actually (need to) have a secondary output), and the outputs of the first, second and third adders 11,12,13 are connected to the second inputs of the multiplier sub-block 30 and the third, second and first accumulator sub-circuits 23,22,21 respectively.

It will be noted that no indication has been given of how the values a and a/2 might be applied to the second inputs of the first and second multipliers 302,306. However, it will be appreciated by a person of ordinary skill in the art that this may be easily achieved simply by storing the values of a and a/2 in an eeprom (or similar non-volatile memory) under the control of a general purpose on-board microcontroller unit. Similarly, it will be apparent that a small number of different values of a and a/2 could be stored on such an eeprom, whereby the microcontroller may select different values of a and a/2 for different circumstances.

Such an arrangement may be particularly advantageous in the present invention as applied to say a GSM or similar system (e.g. UMTS) because the frequency response and bandwidth of the PLL arrangement is likely to vary significantly between the lowest and highest channel frequencies at which the modulator (and thus VCO 4) needs to operate. Being able to alter the values of a and a/2 for different modes of operation of the modulator (e.g. by splitting the entire frequency range of the VCO 14 into a plurality of sub-ranges which may be thought of as different modes of operation of the modulator and each of which will contain a plurality of channels) enables the noise transfer function He(z) to adapt to variations in the PLL bandwidth to maximise the signal to noise ratio across the complete range of operation of the modulator. For example, as is shown schematically in FIG. 3, $f_c$ may be varied to track the variation in the corner frequency 15 of the PLL frequency response bandwidth.

It should by now be apparent to a person skilled in the art that the present invention provides a sequence generator 100 for use in a direct modulation arrangement which is able to receive a relatively large bit, slowly varying input signal X(z) and output a relatively low bit quickly varying signal Y(z) wherein the output signal contains noise which has been modulated by a function which is zero at the central frequency of the modulator (corresponding to the dc component of the input signal Y(z)) and which is also zero (or a minimum value preferably close to zero) for a frequency $f_c$ displaced from the central frequency (corresponding to the component of the input or modulating signal having a frequency $f_c$). According to one described embodiment, this is achieved using a three accumulator 21,22,23 arrangement in combination with a multiplier sub-block 30. However, it will be apparent to persons skilled in the art that other arrangements can be envisaged for achieving a noise transfer function which has at least one zero (or minimum) located away from the frequency corresponding to the dc component of the input signal.

Furthermore, the presently described embodiment only describes the production of a noise transfer function having a single zero located away from the frequency corresponding to the dc component of the input signal. However, for wide-band modulation or for low distortion applications, it may be advantageous to produce a plurality of additional zeros located so as to correspond to frequencies within the bandwidth of the input signal.

Similarly, the above-described embodiment refers to multipliers 302, 306. However, for certain applications a significant improvement in the signal to noise ratio may be achievable by using a relatively simple combination of shift registers and adders to act as simplified multiplier circuitry instead of actual multipliers. Clearly, if any significant reduction in the complexity of the multiplier circuitry, as compared with an actual multiplier, is to be achieved in this way, the number of values which a may take will be significantly restricted. However, for many applications the benefits achievable by simplifying the implimentation of the multiplier circuitry may outweigh the disadvantages associated with restricting the values which a can take. For example, for the case a=½, a multiply-by-a operation is simply a divide-by-2 operation which can be achieved simply by shifting each binary digit one place to the right using a shift register.

What is claimed is:

1. A sequence generator for a frequency synthesiser, the generator comprising an input for receiving an input signal, an output for outputting an output signal and sequence generation means for generating the output signal which is equal to the input signal plus a noise signal modulated by a noise transfer function which has a minimum value both at the frequency corresponding to the dc component of the input signal and at one or more frequencies away from the frequency corresponding to the dc component of the input signal.

2. A sequence generator as claimed in claim 1 wherein the sequence generation means includes multiplier circuitry and a plurality of accumulators.

3. A sequence generator as claimed in claim 2 wherein the multiplier circuitry comprises one or more multipliers.

4. A sequence generator as claimed in claim 2 wherein the multiplier circuitry comprises a combination of one or more shift registers and adders.

5. A sequence generator as claimed in claim 1 wherein the noise transfer function is $$He(z) = (1-z^{-1})^n \cdot \frac{(1 - a \cdot z^{-1} + z^{-2})}{\left(1 - \frac{a}{2} \cdot z^{-1}\right)}$$

where n is an integer greater than or equal to 1 and a is a coefficient not equal to 2.

6. A direct modulator incorporating a sequence generator as claimed in claim 1.

7. A direct modulator as claimed in claim 6 wherein the sequence generation means is adapted to vary the one or more frequencies away from the frequency corresponding to the dc component of the input signal in dependence on the mode of operation of the direct modulator.

8. A mobile telephone including a transceiver incorpating a direct modulator as claimed in claim 6.

9. A method of generating a sequence for a frequency synthesiser forming part of a direct modulator, the method comprising the step of generating an output signal which is equal to an input signal plus a noise signal modulated by a noise transfer function, wherein the noise transfer function has a minimum value both at the frequency corresponding to the dc component of the input signal and at one or more frequencies away from the frequency corresponding to the dc component of the input signal.

10. A method as claimed in claim 9 wherein the step of generating an output signal incorporates a multiplication step.

11. A method as claimed in claim 10 wherein the multiplication step is used in performing an operation on a signal representative of the noise signal when partially modulated, said operation not being a simple digital integration of the partially modulated noise signal, but rather the introduction of a new term which introduces a minimum value in the modulated noise signal at a frequency other than the frequency corresponding to the dc component of the input signal.

12. A method as claimed in claim 9 wherein the noise transfer function is given by $$He(z) = (1-z^{-1})^n \cdot \frac{(1 - a \cdot z^{-1} + z^{-2})}{\left(1 - \frac{a}{2} \cdot z^{-1}\right)}$$

where n is an integer greater than or equal to 1 and a is a coefficient not equal to 2.

* * * * *